United States Patent
Chen et al.

(10) Patent No.: US 7,605,398 B2
(45) Date of Patent: Oct. 20, 2009

(54) APPARATUS OF HIGH DYNAMIC-RANGE CMOS IMAGE SENSOR AND METHOD THEREOF

(75) Inventors: Oscal T.-C. Chen, Taipei (TW);
Wei-Jean Liu, Yuanlin Town (TW);
Hsiu-Fen Yeh, Gangshan Town (TW)

(73) Assignee: National Chung Cheng University, Chia-Yi (TW)

( * ) Notice: Subject to any disclaimer, the term of this patent is extended or adjusted under 35 U.S.C. 154(b) by 613 days.

(21) Appl. No.: 11/211,670

(22) Filed: Aug. 26, 2005

(65) Prior Publication Data
US 2007/0046800 A1 Mar. 1, 2007

(51) Int. Cl.
*H04N 5/335* (2006.01)
(52) U.S. Cl. .......................... 257/48; 257/431; 257/459; 257/461; 348/308
(58) Field of Classification Search ................ 348/308; 257/84, 431, 448, 459, 461
See application file for complete search history.

(56) References Cited

U.S. PATENT DOCUMENTS
2005/0285959 A1 * 12/2005 Nakajima et al. .......... 348/308

FOREIGN PATENT DOCUMENTS
WO    WO03/094110    * 11/2003    .................. 348/308

* cited by examiner

*Primary Examiner*—Michael B Shingleton
(74) *Attorney, Agent, or Firm*—Rosenberg, Klein & Lee (57) ABSTRACT

The present invention discloses an apparatus of high dynamic-range CMOS image sensor and method thereof. The present invention utilize a pixel circuit outputting an output signal, wherein the pixel circuit has a photodiode and a plurality of transistors; and utilize a current source as a charge supplement unit to supply current into one end of the photodiode, and providing charges to the parasitic capacitor of the photodiode to delay saturation in the pixel circuit. In addition, a feedback circuit can be further designed connecting the pixel circuit. The feedback circuit receives the output signal from the pixel circuit and then outputs a control signal according to the output signal of the pixel circuit to control status of the charge supplement unit, and thereby increasing the dynamic range of the CMOS image sensor.

20 Claims, 10 Drawing Sheets

APPARATUS OF HIGH DYNAMIC-RANGE CMOS IMAGE SENSOR AND METHOD THEREOF

BACKGROUND OF INVENTION

1. Field of the Invention

The invention relates to an apparatus of high dynamic-range CMOS image sensor and method thereof, and more particularly, to an apparatus of high dynamic-range CMOS image sensor and method thereof that providing charge supplement to the photodiode.

2. Description of the Prior Art

Dynamic range is an important norm to evaluate quality of an image sensor. Larger the dynamic range, larger the sensible range from lowest sensible signal to highest unsaturated signal of the image sensor is.

Technologies of designing image sensors with high dynamic ranges can be classified into various methods: photonic signal compression, multiple sampling, exposure-time adjustment and so on. In the conventional technologies, the photonic signal compression method will lower the sensitivity of an image sensor, especially the signal noise ratio will be smaller under low illumination, and the Correlated Double Sampling (CDS) circuit cannot be used to reduce the Fixed Pattern Noise (FPN) due to no reset signal, so the image quality is limited. In addition, this method combining linear and logarithmic integration modules will make extra power consumption and increase design complexity of the signal processing circuit. The methods of multiple sampling and exposure-time adjustment can achieve high sensitivity and increase the dynamic range, but the exposure time must be adequately controlled by the complex backend circuit. This backend circuit will enlarge the chip size, and its processing time will reduce the reading speed that makes the sensor cannot capture images immediately.

Hence, the present invention discloses an apparatus of high dynamic-range CMOS image sensor and method thereof to overcome the above-mentioned drawbacks.

SUMMARY OF INVENTION

It is therefore a primary objective of the claimed invention to provide an apparatus of high dynamic-range CMOS image sensor and method thereof that have a charge supplement unit in the pixel circuit to provide charges to the parasitic capacitor of the photodiode for the purpose of supplying charges and delaying saturation.

It is therefore another objective of the claimed invention to provide an apparatus of high dynamic-range CMOS image sensor and method thereof that utilize a feedback circuit to duly send a trigger signal to the charge supplement unit when the node voltage of photodiode descends to a predetermined value.

It is therefore a further objective of the claimed invention to provide an apparatus of high dynamic-range CMOS image sensor and method thereof that retain the reset signal for the correlated double sampling circuit to effectively reduce the fixed pattern noise.

It is therefore a further objective of the claimed invention to provide an apparatus of high dynamic-range CMOS image sensor and method thereof that utilize the feedback circuit and charge supplement unit to make the image sensor applicable in the high contrast environment without changing exposure time and make each pixel having an independent high dynamic range.

According to the claimed invention, an apparatus of high dynamic-range CMOS image sensor and method thereof utilize a pixel circuit outputting an output signal, wherein the pixel circuit has a photodiode and a plurality of transistors; and utilize a current source as a charge supplement unit to supply current into one node of the photodiode, and providing charges to the parasitic capacitor of the photodiode to delay saturation in the pixel circuit. In addition, a feedback circuit can be further designed connecting the pixel circuit. The feedback circuit has a PMOS source follower and a PMOS inverter, and after receiving the output signal from the pixel circuit, the feedback circuit will generate a control signal according to this output signal to control status of the charge supplement unit and then enhance the dynamic range of the CMOS image sensor.

These and other objectives of the present invention will no doubt become obvious to those of ordinary skill in the art after reading the following detailed description of the preferred implement that is illustrated in the various figures and drawings.

10 pixel circuit
12 charge supplement unit
14 feedback circuit
16 PMOS inverter
18 PMOS source follower
20 output node of pixel circuit
22 photodiode
24 control node of charge supplement unit
26 correlated double sampling (CDS) circuit
28 subtraction circuit
30 pixel's amplifier circuit

DETAILED DESCRIPTION

The present invention discloses an apparatus of high dynamic-range CMOS image sensor and method thereof. The present invention provides charge supplement with a charge supplement unit, and the charge supplement unit can be controlled by using an external bias voltage or connecting a feedback circuit to enable that the saturation time of the parasitic capacitor of the photodiode can be delayed and the dynamic range of the image sensor can be enlarged. The present invention also has the advantages of low noise, high sensitivity and low complexity.

Figure 1:
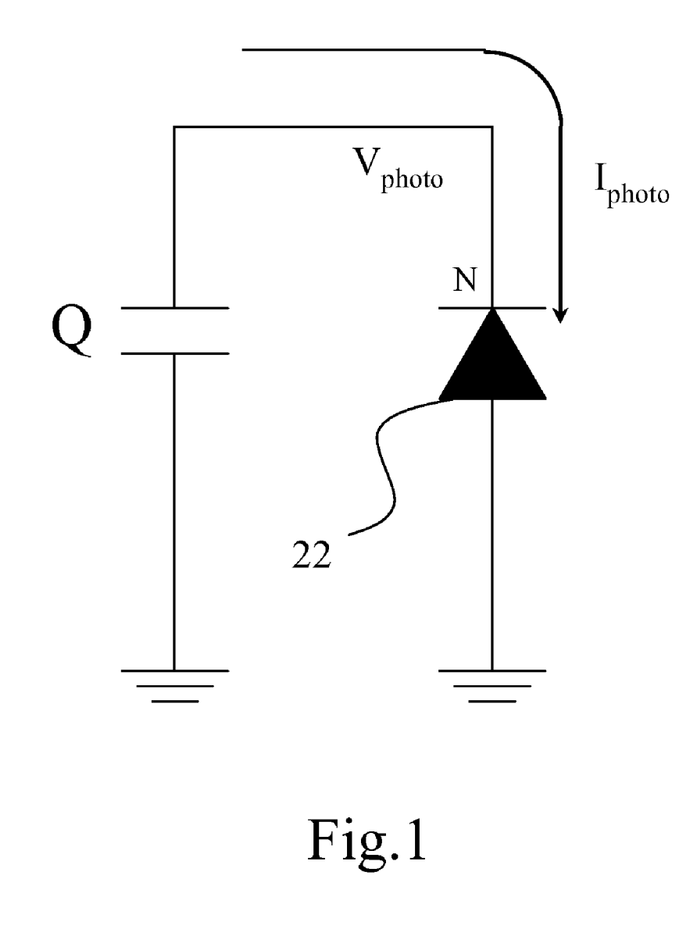
FIG. 1 is a schematic diagram showing the discharge of accumulative charges in a parasitic capacitor of photodiode.

As shown in FIG. 1, after resetting the photodiode 22, the N terminal is biased to a high voltage level and this bias makes the parasitic capacitor having induced charge Q. Amount of the charge is reacted on the voltage $V_{photo}$ of the N terminal of the photodiode 22, wherein $I_{photo}$ is the photo current of the photodiode 22 after illuminated, and the charges will be discharged through the path of the photo current. When the induced charge Q on the parasitic capacitor is fully discharged, the terminal voltage $V_{photo}$ will reduce to the lowest value. At this time, even though the photo current still flows, $V_{photo}$ will not be changed, and this is so called saturation of the photodiode 22. In FIG. 1, under the same integration time in a photodiode 22, the amount of $I_{photo}$ decides when the saturation occurs. Larger $I_{photo}$ yields saturation easier and smaller $I_{photo}$ yields saturation more difficult.

Figure 2:
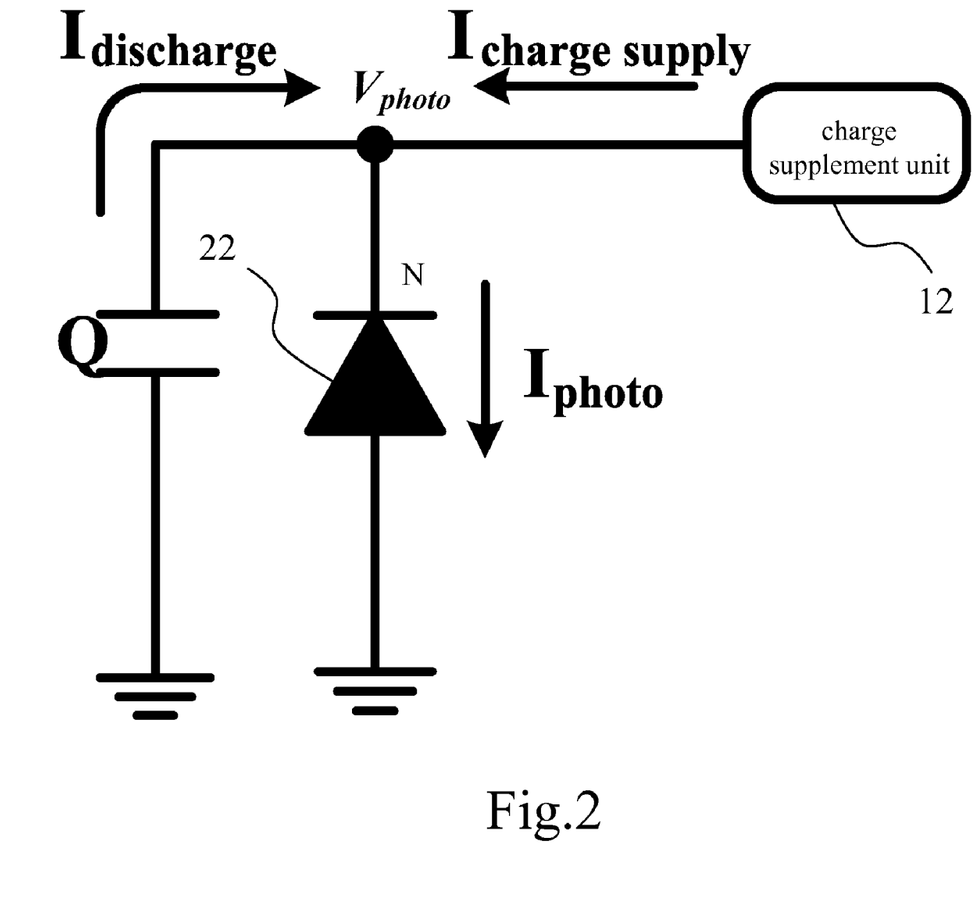
FIG. 2 is a schematic diagram of a charge supplement unit reducing discharging current and postponing pixel saturation according to the present invention.

For reducing the amounts of $I_{photo}$ and discharging current, FIG. 2 discloses a schematic diagram of the present invention. $I_{discharge}$ is the discharging current of the parasitic capacitor in a photodiode, and $I_{charge-supply}$ is a current source serially connected to the N terminal of a photodiode that can be a dependent or independent current source. According to the Kirchcoff's law, each current source meets the relationship:

$$I_{photo} = I_{discharge} + I_{charge-supply}$$

The discharging current $I_{discharge}$ becomes ($I_{photo} - I_{charge-supply}$), and the pixel saturation will be delayed due to the lowered discharging current. Approaching the saturation, a charge supplement unit 12 starts continuously supplying charges to the parasitic capacitor in a photodiode, and this makes the parasitic capacitor in a photodiode obtaining charge supplement under high illumination, so that the sensor will delay the saturation caused by rapid discharging of the photodiode.

The conception in FIG. 2 can be also extended to other designs to supply charges. The simplest method, as shown in FIG. 2, is directly providing an independent current source at the N terminal of the photodiode for charge supplement. The timing of acting the charge supplement unit and amount of supplied charges depend on the illumination, so the structure can be designed as what shown in FIG. 3. The output signal of the pixel circuit 10 is outputted into a feedback circuit 14, and the output signal of the feedback circuit 14 can be used for controlling the operation status of the charge supplement unit 12. Depending on different requirements, the feedback circuit 14 can be designed to have different respond curves. Q in the figure is the accumulative charges of the parasitic capacitor in a photodiode, and the amount of charges is reacted on the terminal voltage $V_{photo}$ of the photodiode 22. After processed by the pixel's amplifier circuit 30, $V_{photo}$ is used as the input signal of the feedback circuit 14, and the output signal of the feedback circuit 14 is sent to the charge supplement unit 12 as a control signal.

Figure 3:
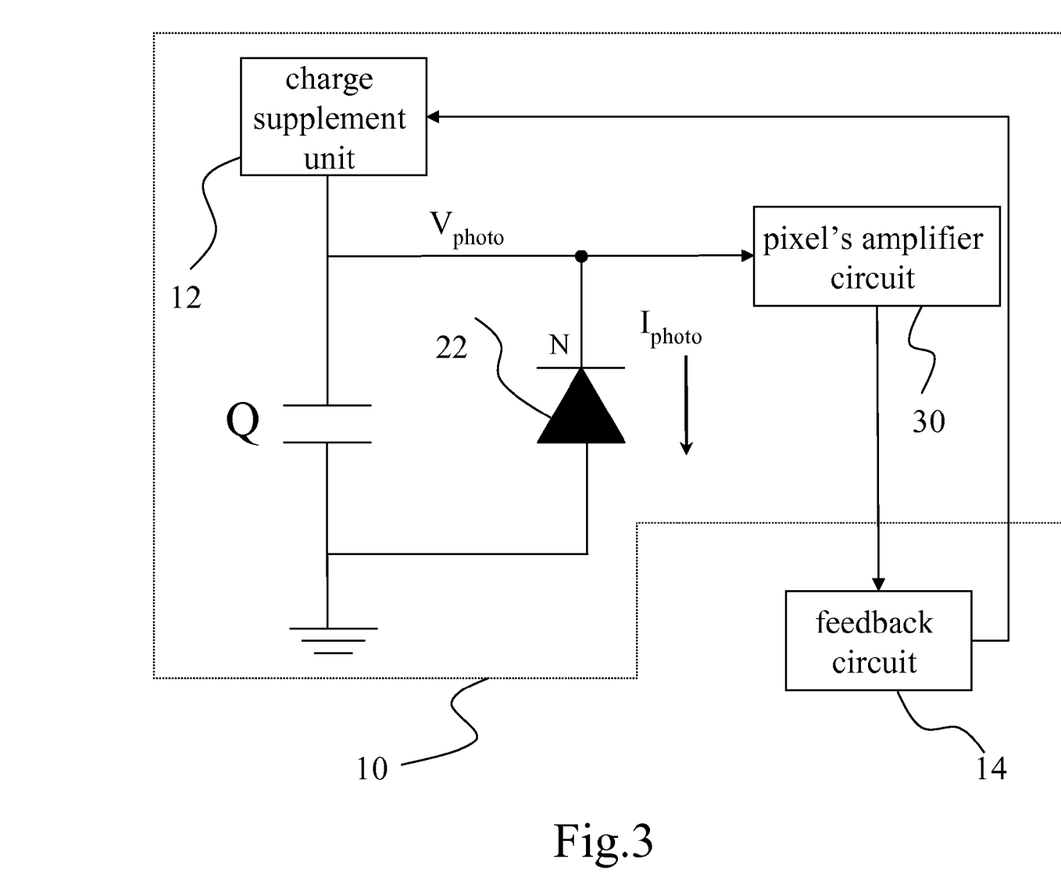
FIG. 3 is a block diagram of a feedback circuit controlling the charge supplement unit according to the present invention.

Based on the structure of the conventional pixel circuit using the linear integration module, a practical example of an image sensor is realized by using the charge supplement mechanism with the feedback circuit, as shown in FIG. 3.

Figure 4:
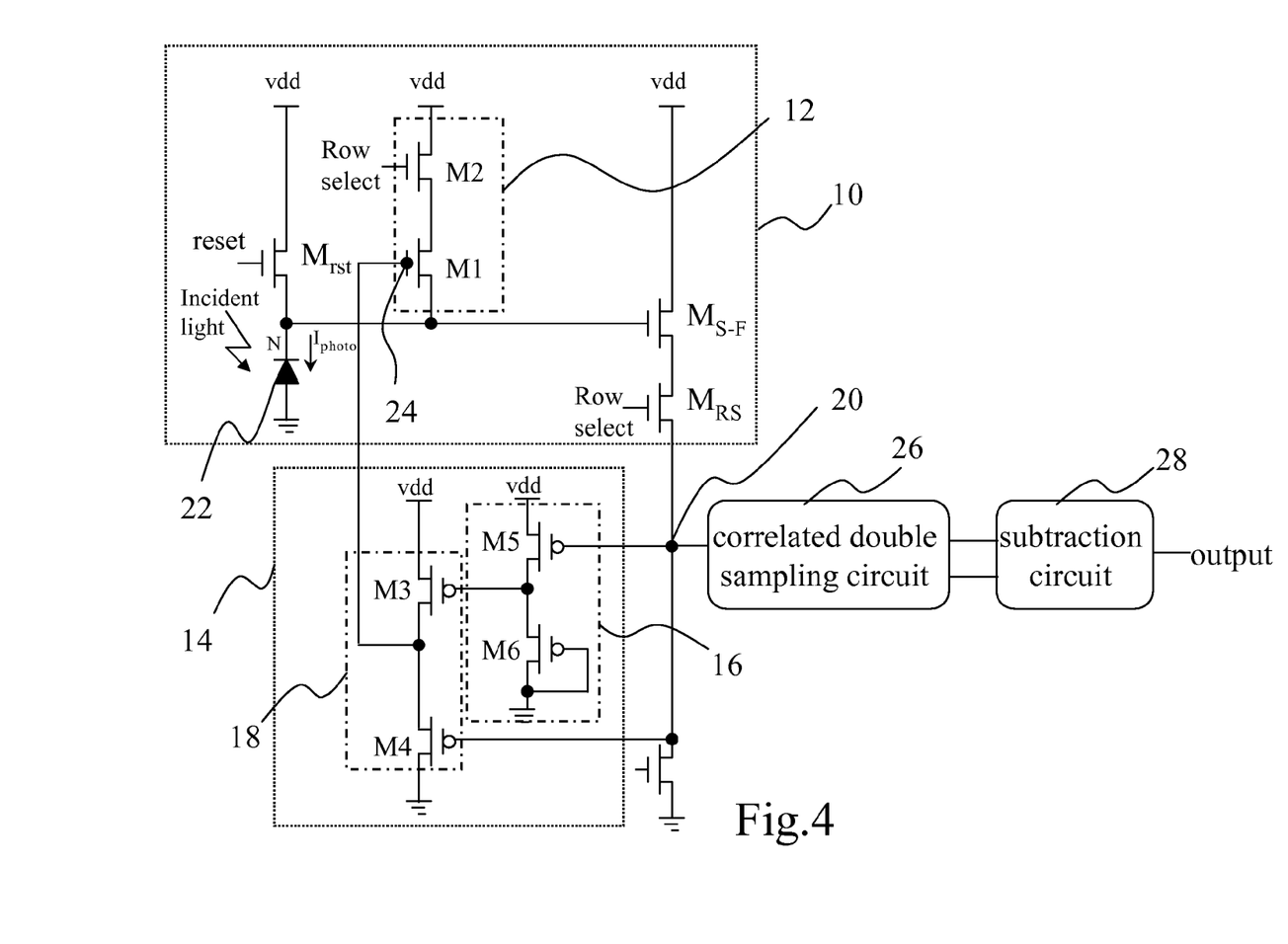
FIG. 4 is a circuit diagram of one implement using the feedback circuit to control the charge supplement unit according to the present invention.

As shown in FIG. 4, the circuit diagram includes a pixel circuit 10 and a feedback circuit 14, a correlated double sampling (CDS) 26 and a subtraction circuit 28. Except the photodiode 22, reset transistor $M_{rst}$, source follower $M_{S-F}$ and row select transistor $M_{RS}$, the pixel circuit 10 also includes the charge supplement unit 12 for supplying charges. The charge supplement unit 12 is composed of two transistors, M1 and M2, installed on N terminal of the photodiode 22, wherein M1 is a charge supplement transistor for continuously providing current and M2 is a transistor for reducing power consumption. When M1 is in the standby status, M2 can hold the current going through M1 to reduce power consumption. The feedback circuit 14 includes a PMOS source follower 18 which is composed of PMOS transistors M3 and M4, wherein the transistor M3 is an active loading of M4, and the source of M3 is connected to drain of M4 as an output node of the PMOS source follower 18. The output node is further connected to a control node 24 of the charge supplement unit 12, and gate of M4 is connected to the output signal terminal 20 of the pixel circuit 10. Gate of the transistor M3 is further connected to the output terminal of the PMOS inverter 16 which is composed of PMOS transistors M5 and M6. The PMOS inverter 16 can be viewed as an amplifier with variable active loading, wherein the transistor M6 is the active loading whose gate and drain are connected to ground, and source is connected to the output terminal of the PMOS inverter 16 as the output loading of the PMOS inverter 16. The transistor M5 is used for inversely amplifying signals whose gate is connected to the output node 20 of the output signal of the pixel circuit 10, and drain is connected to source of the transistor M6 as an output node of the PMOS inverter 16. Drain of M5 is further connected to gate of M3.

Please refer to part of the pixel circuit 10 in FIG. 4. A fixed current or a variable current can be inputted to the N terminal of the photodiode 22. If the inputted current is fixed, the photodiode 22 is not saturated and the gate-source voltage difference $V_{gs}$ of M1 approximates to the threshold voltage $V_t$, M1 will work in the weak inversion region. Since the source voltage $V_s$ of M1 is also the voltage $V_{photo}$ of the photodiode 22, the condition of the gate-source voltage difference $V_{gs}$ of M1 equals $V_g - V_{photo}$ operated in the weak inversion region is:

$$V_{gs} = V_g - V_{photo} \approx V_t$$

After M1 enters the weak inversion region, M1 provides a charge supplement current to the parasitic capacitor of the photodiode 22. Under low illumination, M1 is not conducted and the pixel circuit is kept on the linear operation status; under high illumination, the photodiode 22 produces a larger induced current to rapidly discharge the parasitic capacitor of the photodiode 22 and $V_{photo}$ is also lowered. Faster the $V_{photo}$ lowers, larger the source current of M1 increases following the voltage difference $V_{gs}$. This source current can be used for supplying charges to the photodiode and postponing saturation. In addition, amount of the source current is decided by the bias voltage applied on the control node 24 of the charge supplement unit.

Figure 5:
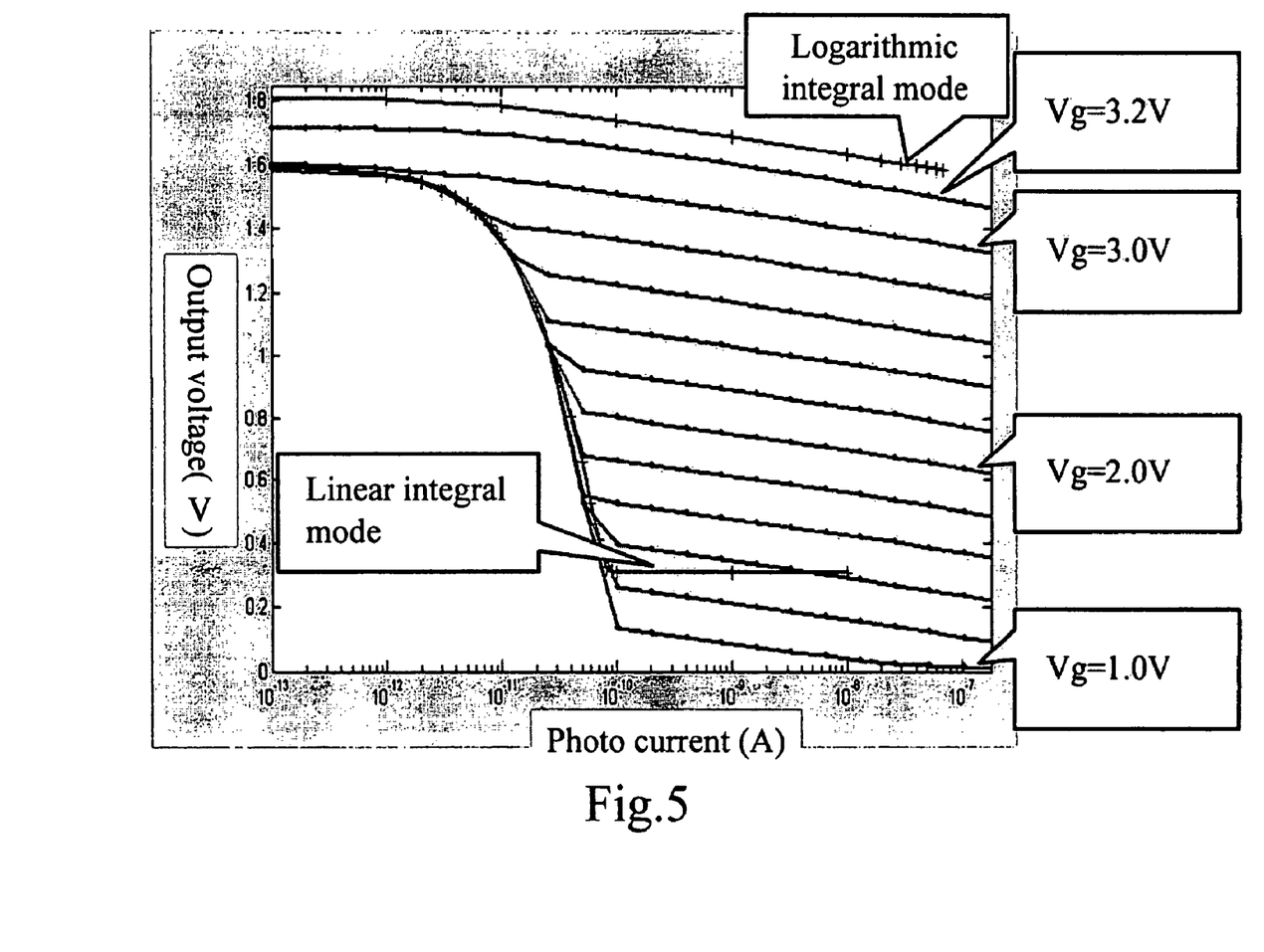
FIG. 5 is a conversion diagram of photo currents to output voltages simulated with a pixel circuit according to the present invention.

The pixel circuit 10 is constructed at a linear integration structure. For proving that the pixel circuit 10 can effectively enhance the dynamic range, the gate of M1 is addressed by the fixed control voltage $V_g$, and the variation of terminal voltage of the photodiode 22, or the source voltage $V_s$ of M1, is observed under the simulation of different photo currents $I_{photo}$ induced by the illuminated photodiode 22 under the same integration time. The simulated result is shown in FIG. 5, wherein different curves mean the effect of $V_s$ to $I_{photo}$ under different $V_g$. As shown in FIG. 5, at the fixed $V_g$, when the illumination is lower, $I_{photo}$ is smaller and terminal voltage of the photodiode 22, namely $V_s$, is higher. When $V_{gs} < V_t$ happens in the transistor M1, M1 is not conducted and the pixel circuit 10 is operated at a linear mode, so the advantage of high sensitivity in a linear mode can be kept. When the illumination is gradually increased, M1 will enter the weak inversion region in a specific point, and the pixel circuit 10 is operated at a logarithm mode that can effectively slow down the happening of saturation. Under different $V_g$, the specific point of M1 for the pixel circuit 10 from the linear mode to the logarithm mode will be different. From the simulated result in FIG. 5, we can find higher the $V_g$ easier the M1 enters the weak inversion region, so that the pixel circuit 10 with a higher output voltage can turn on charge supplement mechanism more easily to make itself operated at the logarithm integration mode. Lower the $V_g$ harder the M1 enters the weak inversion region, so that the corresponding output voltage is lower under the same photo current. FIG. 5 further includes two curves, which are the simulated results of the pixel circuit in the linear integration mode and the logarithm integration mode. Under the same exposure time, the circuit in the linear integration mode reaches the saturation status when the photo current is $10^{-10}$ ampere. The disadvantage of the logarithm integration mode is the low sensitivity such that the variation of output voltage is only 0.2V when the photo current changes from $10^{-13}$ ampere to $10^{-7}$ ampere.

Figure 6:
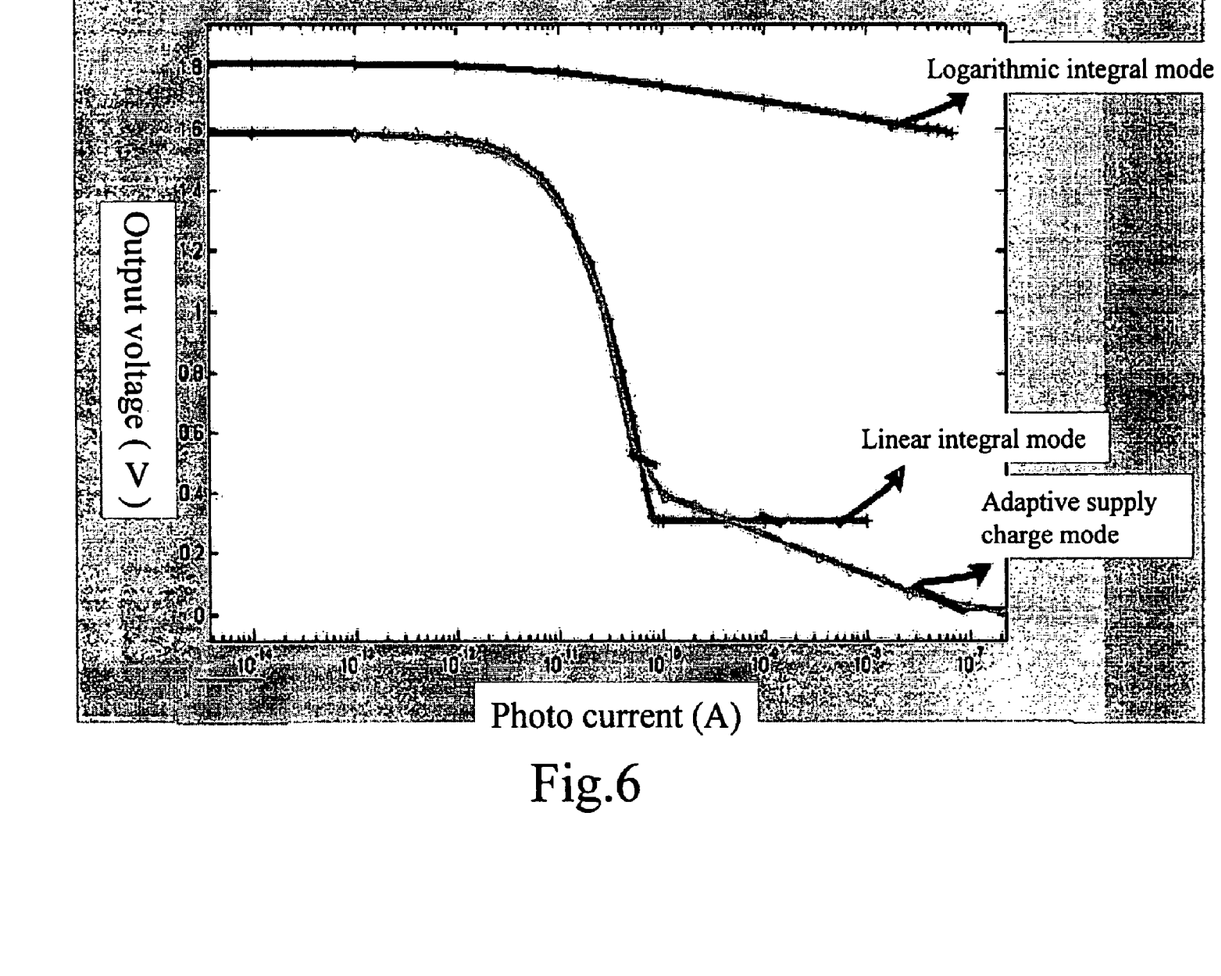
FIG. 6 is a schematic diagram of the trigger voltage required in the charge supplement mode according to the present invention.
Figure 7:
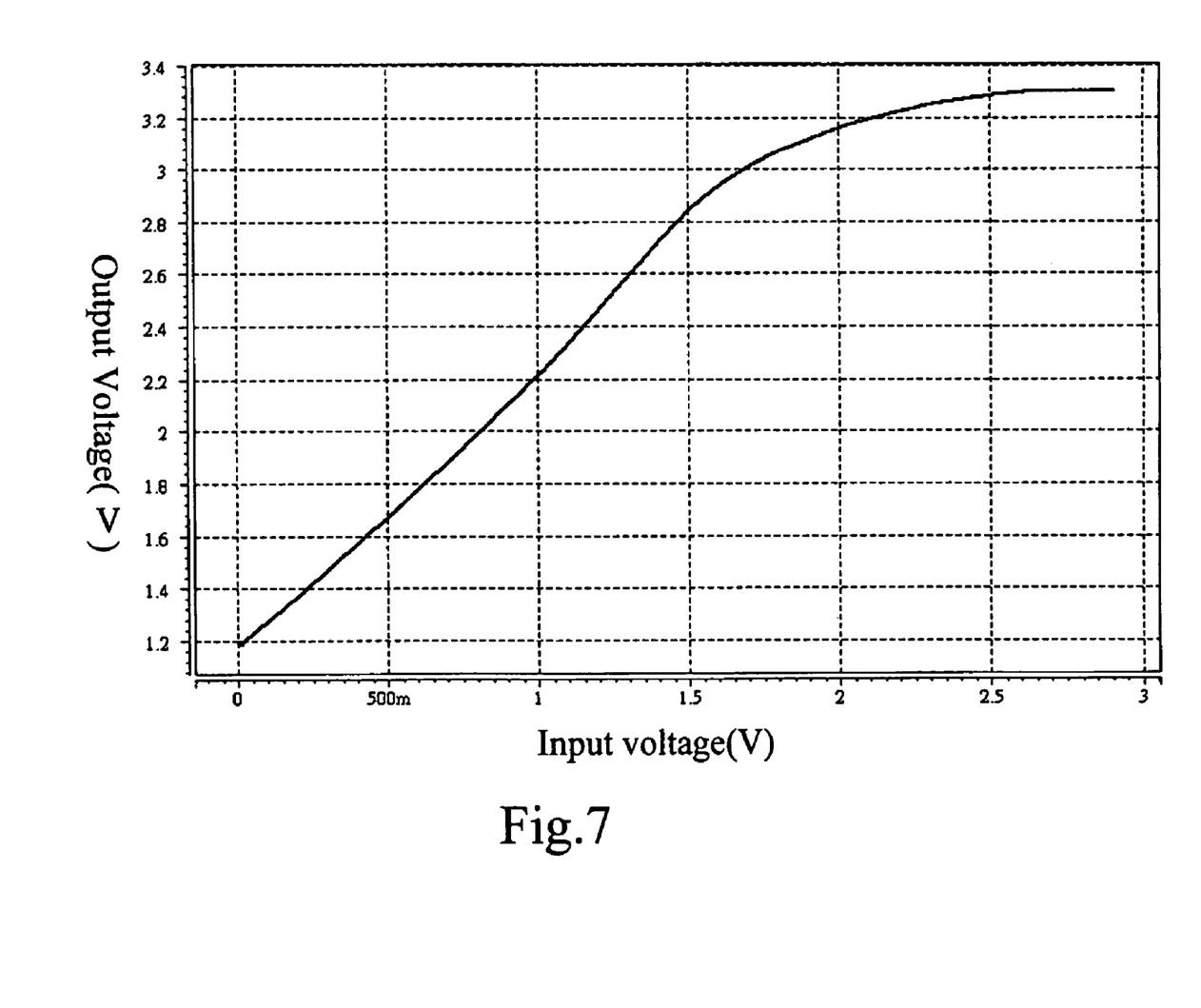
FIG. 7 is a response diagram of input voltages to output voltages of a feedback circuit according to the present invention.

As shown in FIG. 4, when $10^5$ Lux light illuminates on the photodiode 22 of the pixel circuit 10, the pixel circuit 10 which has a size of 5 μm×5 μm, manufactured by Taiwan Semiconductor Manufacturing Company (TSMC) with 2-Poly 4-Metal 0.35 μm CMOS process, can produce 1.678 nA photo current. The pixel circuit 10 using this current value coordinating with the trigger voltage required in the charge supplement mode shown in FIG. 6 can obtain the response curve of input voltage to output voltage of a feedback circuit shown in FIG. 7. The pixel circuit 10 sends an output signal to the feedback circuit 14, and the feedback circuit 14 transforms the output signal into a control signal to determine turning on/off of the charge supplement unit. The control signal is sent to the control node 24 of the charge supplement unit 12, and the charge supplement unit 12 performs turning on/off according to the control signal. When approaching the saturation mode under high illumination, the terminal voltage of photodiode 22 will decrease to the lowest value and the control signal from the feedback circuit 14 is employed to turn on the charge supplement unit 12. The charge supplement unit 12 begins supplying charges to the parasitic capacitor of photodiode 22 to slow down the voltage drop of the parasitic capacitor of photodiode 22 and delay the saturation of photodiode 22. Under the middle or low illumination, the output signal of pixel circuit 10 decreases progressively with the discharging photo current. Output voltage of the PMOS inverter 16 in the feedback circuit 14 is increased, and then raises the gate voltage of the PMOS amplifier with active loading and enlarges the loading value of the PMOS amplifier with active loading, so that the output voltage of the PMOS amplifier rapidly decreases and the slope of output response, slew rate, is enlarged. At this time, the signal from the feedback circuit 14 is used to turn off charge supplement and hold the charge supplement unit 12, and the sensitivity of the pixel circuit 10 in the linear integration mode can be also kept under middle or low illumination.

Figure 8:
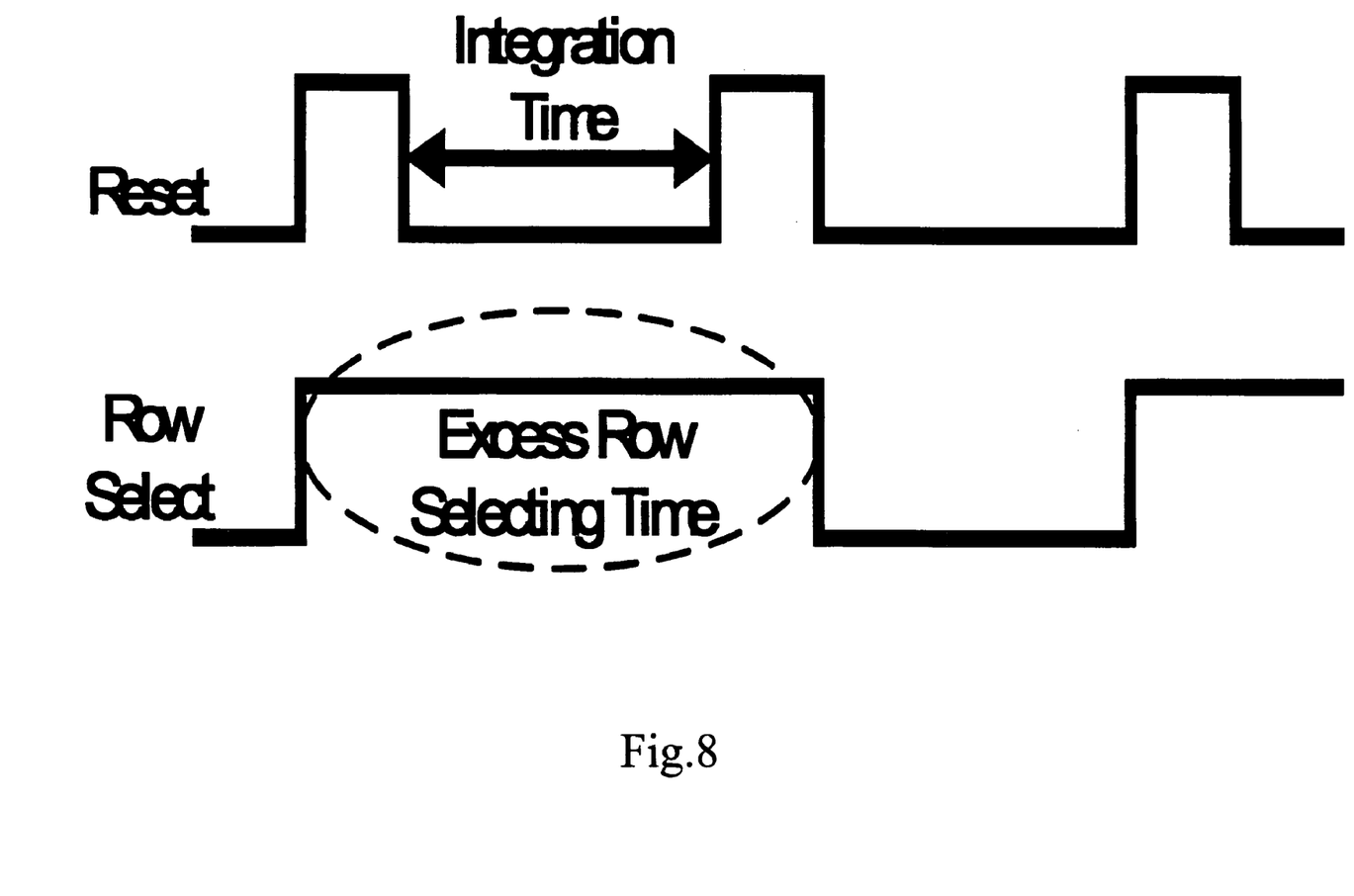
FIG. 8 is a schematic diagram of a timing control in an implement according to the present invention.
Figure 9:
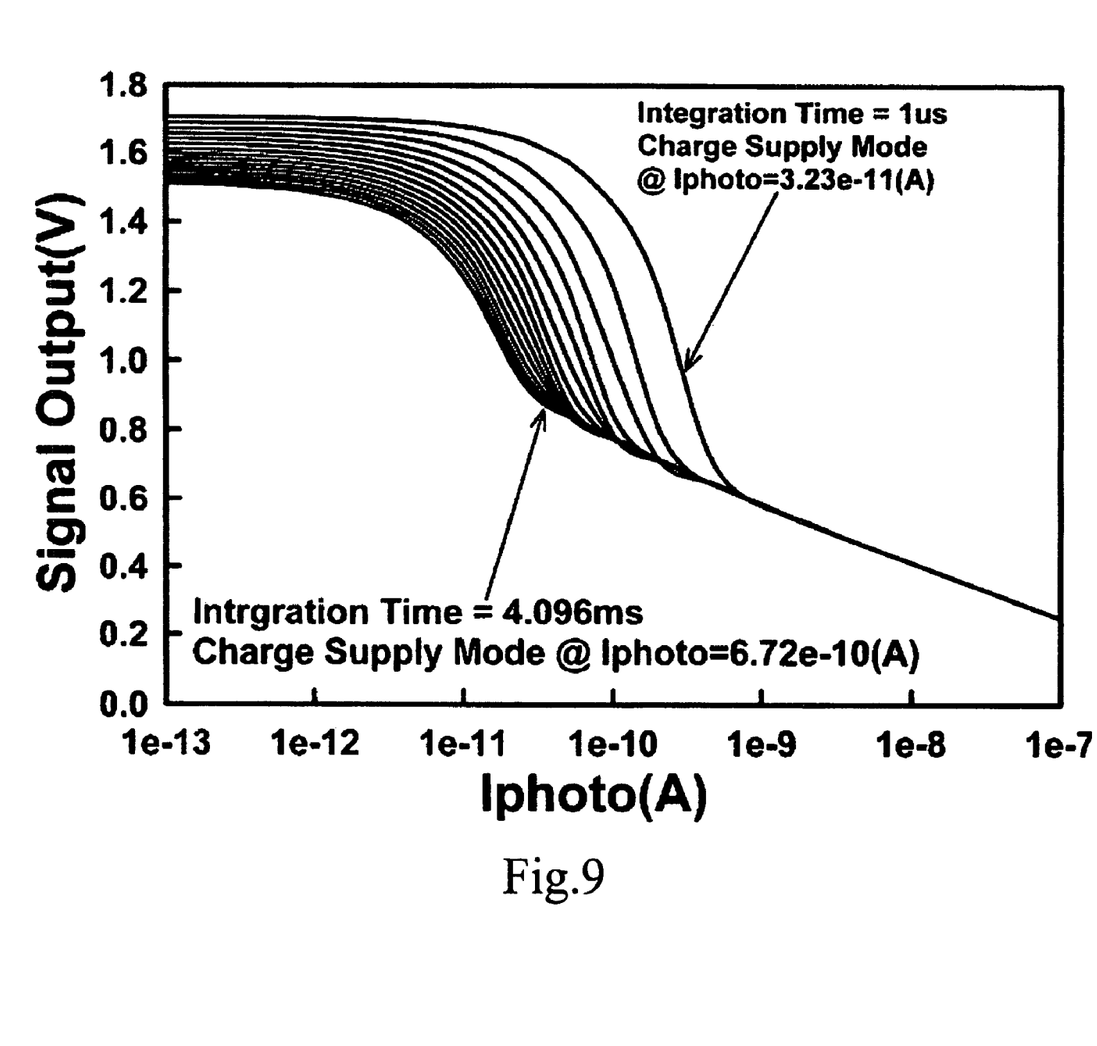
FIG. 9 is a conversion diagram of photo currents to output voltages according to the present invention.

FIG. 8 is a timing control diagram. The circuit in FIG. 4 is operated at this timing control diagram, wherein the active period of the row-select transistor $M_{RS}$ must be extended to make the row select-transistor $M_{RS}$ conducting during the exposure time and make the feedback circuit 14 synchronously obtaining the output signal from the pixel circuit 10. FIG. 9 is a diagram of conversion from photo currents to output voltages according to the present invention, and the curves from left to right are under the exposure time from 1 μs to 4.096 ms. If the exposure time is longer, the pixel will switch to the charge supplement mode earlier, so that a shorter exposure time must be used in a high illumination environment. When the pixel circuit 10 is operated at the condition of the curve on left side in FIG. 9, it is switched to the charge supplement mode later so the image frame can have larger linear response area under middle illumination condition. On the other hand, if the environment is under low illumination, long exposure time should be used to increase the signal noise ratio, and the pixel circuit 10 is operated at the condition of the curve on right side in FIG. 9, wherein the pixel circuit 10 is switched to the charge supplement mode early so the image frame will not enter the saturation region caused by long integration time. This adaptive technique can make the image sensor capture images clearly.

Figure 10:
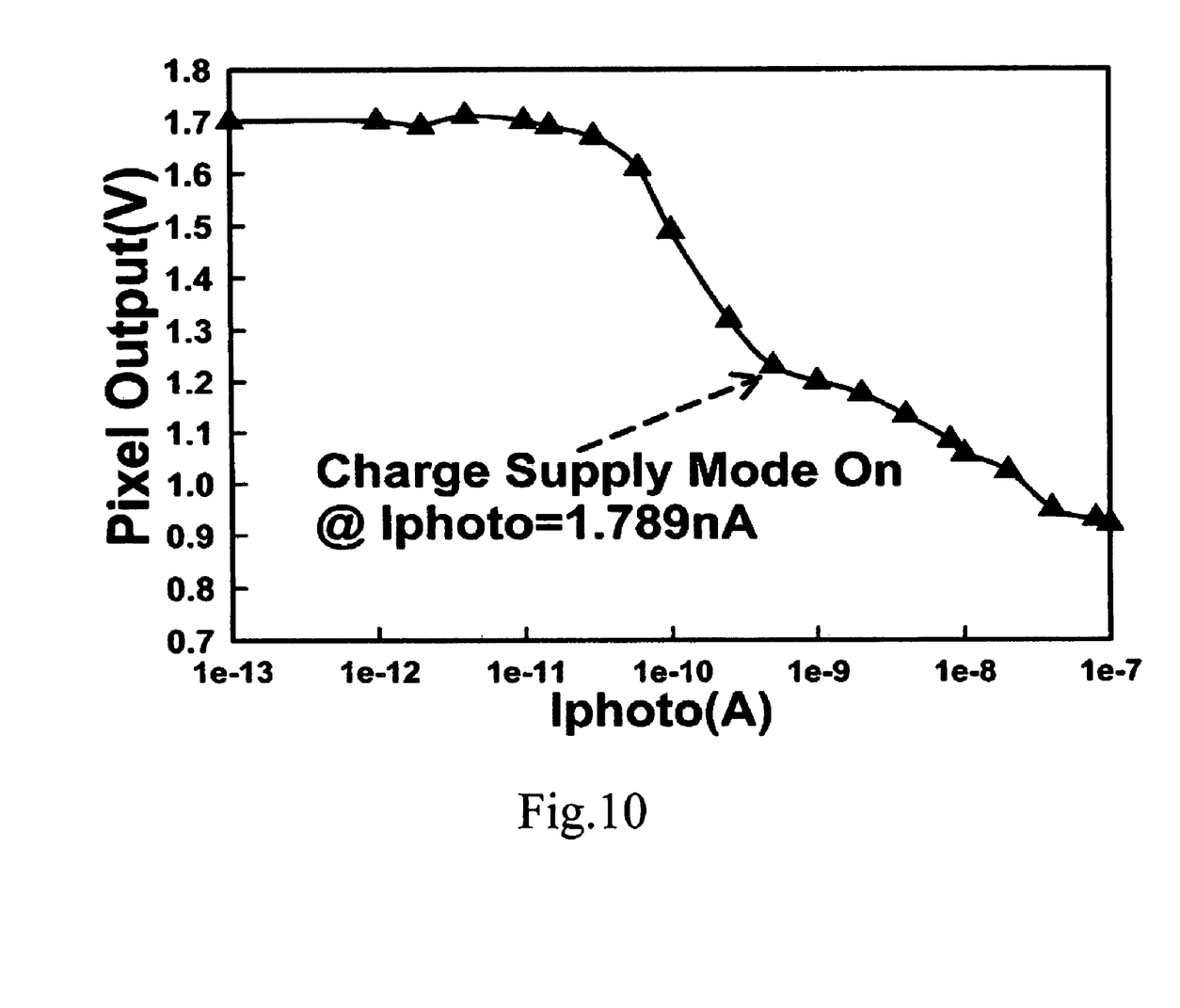
FIG. 10 is a diagram of illumination to output voltages measured with a test chip according to the present invention.

In addition, the present invention is realized by using the 2P4M 0.35 μm process provided by TSMC, and the measured result of the test chip of the proposed 5×5-pixel image sensor is shown in FIG. 10. The curve is measured at the gate of the transistor M1 in the charge supplement unit applied to the bias voltage of 0V, and when the bias voltage is 0V, M1 does not be active and the pixel circuit is equivalent to a traditional APS circuit. When the photonic illumination is 5000~80000 Lux, the curve of equivalent traditional APS circuit enters the saturation status. Additionally, the image sensor senses 75000 Lux in the logarithmic response, and after calculated with the dynamic range formula, the result demonstrates that the dynamic range is effectively enhanced by the proposed image sensor.

In conclusion, the present invention is an apparatus of high dynamic-range CMOS image sensor and method thereof. The basic conception is using the charge supplement module to supply charges to the parasitic capacitor in the photodiode to delay the saturation. The charge supplement unit can utilize not only the external bias signal to control turning on/off of the charge supplement unit and amount of charges supplied but also the feedback circuit to control whether the charge supplement unit provides charges to delay the saturation time of the photodiode. The turning on/off of the charge supplement unit and the amount of charges supplied depends on the illumination, so that the output signal of the pixel circuit can be sent to the feedback circuit and then the control signal from the feedback circuit can be used for controlling the operation status of the charge supplement unit. The photodiode will not rapidly discharge the photo current under high illumination to become saturation, so that the dynamic range can be effectively enhanced. The present invention need not change the exposure time under high contrast environment, and each pixel has an independent large dynamic range. In the pixel circuit, the reset signal is also retained and suitable for the correlated double sampling circuit. The present invention has advantages of high sensitivity, large dynamic range, low circuit complexity, only once-required reset and low fixed pattern noise.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An apparatus of high dynamic-range CMOS image sensor, the apparatus utilizes charge supplement to supply charges to the parasitic capacitor of photodiode in image sensor and delay saturation, the apparatus comprising:

a charge supplement unit installed on one end of a photodiode in a pixel circuit, the pixel circuit yields an output signal and the charge supplement is achieved by a current source that provides charges to the parasitic capacitor of the photodiode to supply charges, the current source being a constant current source or a variable current source, the charge supplement unit further including a control node, wherein a current of the variable current source is controlled by supplying a bias signal onto the control node.

2. The apparatus of high dynamic-range CMOS image sensor of claim 1, wherein the constant current source provides charge supplement to delay saturation of the pixel circuit.

3. The apparatus of high dynamic-range CMOS image sensor of claim 1, wherein the pixel circuit is linear integration mode.

4. The apparatus of high dynamic-range CMOS image sensor of claim 1, wherein the charge supplement unit can supply charges to the parasitic capacitor of the photodiode during discharging to enhance the dynamic range of the CMOS image sensor.

5. An apparatus of high dynamic-range CMOS image sensor, the apparatus utilizes charge supplement to supply charges to the parasitic capacitor of photodiode in image sensor and delay saturation, the apparatus comprising:
a charge supplement unit installed on one end of a photodiode in a pixel circuit, the pixel circuit yields an output signal; and
a feedback circuit connected to the pixel circuit through an input node and outputting a control signal according to the output signal of the pixel circuit to control status of the charge supplement unit.

6. The apparatus of high dynamic-range CMOS image sensor of claim 5, wherein a current can be inputted into the end of the photodiode to supply charges to the photodiode and delay saturation.

7. The apparatus of high dynamic-range CMOS image sensor of claim 6, wherein the current is provided by a variable current source controlled by an output signal of the feedback circuit.

8. The apparatus of high dynamic-range CMOS image sensor of claim 7, wherein the variable current source provides charge supplement to delay saturation of the pixel circuit.

9. The apparatus of high dynamic-range CMOS image sensor of claim 7, wherein the control signal is used for controlling current of the variable current source.

10. The apparatus of high dynamic-range CMOS image sensor of claim 5, wherein the pixel circuit is linear integration mode.

11. The apparatus of high dynamic-range CMOS image sensor of claim 5, wherein the charge supplement unit can supply charges to the parasitic capacitor of the photodiode during discharging to enhance the dynamic range of the CMOS image sensor.

12. The apparatus of high dynamic-range CMOS image sensor of claim 5, wherein the charge supplement unit further comprises a control node, the control node can determine whether turning on the charge supplement unit and amount of the charges supplied according to the control signal of the feedback circuit.

13. The apparatus of high dynamic-range CMOS image sensor of claim 12, wherein current of a variable current source utilizes the output signal of the feedback circuit as a bias signal to control the control node of the charge supplement unit.

14. The apparatus of high dynamic-range CMOS image sensor of claim 12, wherein the output signal of the pixel circuit is processed by the feedback circuit and then the output signal of the feedback circuit is transmitted to the control node of the charge supplement unit to control current of the variable current source.

15. The apparatus of high dynamic-range CMOS image sensor of claim 5, wherein the feedback circuit comprises a PMOS source follower and a PMOS inverter.

16. The apparatus of high dynamic-range CMOS image sensor of claim 12 or 15, wherein the PMOS source follower comprises a first transistor and a second transistor, and drain of the first transistor is connected to source of the second transistor to be an output node of the PMOS source follower, and the PMOS inverter comprises a third transistor and a fourth transistor, and drain of the third transistor is connected to source of the fourth transistor to be an output node of the PMOS inverter, and the output node of the PMOS source follower is connected to the control node of the charge supplement unit.

17. The apparatus of high dynamic-range CMOS image sensor of claim 16, wherein the output signal of the pixel circuit is transmitted to gates of the first and third transistors simultaneously.

18. The apparatus of high dynamic-range CMOS image sensor of claim 16, wherein the output node of the PMOS inverter is connected to gate of the fourth transistor.

19. The apparatus of high dynamic-range CMOS image sensor of claim 5, wherein the feedback circuit can comprise an amplifier with variable active loading, controlled by the output signal of the pixel circuit.

20. The apparatus of high dynamic-range CMOS image sensor of claim 5, wherein the feedback circuit controls the charges of the charge supplement unit supplying into the photodiode by using a voltage-level way.

* * * * *